United States Patent
Kaneko et al.

(10) Patent No.: US 8,350,311 B2
(45) Date of Patent: Jan. 8, 2013

(54) SEMICONDUCTOR DEVICE

(75) Inventors: Yoshiyuki Kaneko, Kanagawa (JP);
Hiroyasu Noso, Kanagawa (JP);
Katsuhiko Hotta, Kanagawa (JP);
Shinichi Ishida, Kanagawa (JP);
Hidenori Suzuki, Kanagawa (JP);
Sadayoshi Tateishi, Kanagawa (JP)

(73) Assignee: Renesas Electronics Corporation, Kawasaki-shi (JP)

(*) Notice: Subject to any disclaimer, the term of this patent is extended or adjusted under 35 U.S.C. 154(b) by 35 days.

(21) Appl. No.: 12/975,406

(22) Filed: Dec. 22, 2010

(65) Prior Publication Data
US 2011/0156208 A1   Jun. 30, 2011

(30) Foreign Application Priority Data

Dec. 25, 2009   (JP) ................... 2009-295242

(51) Int. Cl.
*H01L 27/108* (2006.01)
*H01L 21/8242* (2006.01)

(52) U.S. Cl. ............... 257/301; 257/305; 257/E29.346; 257/E21.396; 257/E27.092; 438/243; 438/244; 438/386

(58) Field of Classification Search ............... 438/243, 438/244, 386, 387, 653; 257/301, 305, E29.346, 257/E21.396, E27.092
See application file for complete search history.

(56) References Cited

U.S. PATENT DOCUMENTS

| | | | |
|---|---|---|---|
| 5,793,600 A * | 8/1998 | Fukuda et al. | 361/321.4 |
| 6,287,965 B1 * | 9/2001 | Kang et al. | 438/648 |
| 6,660,631 B1 * | 12/2003 | Marsh | 438/680 |
| 6,849,166 B2 * | 2/2005 | Kita | 204/192.15 |
| 2002/0000598 A1 * | 1/2002 | Kang et al. | 257/301 |
| 2006/0115950 A1 * | 6/2006 | Kim et al. | 438/381 |
| 2006/0255428 A1 | 11/2006 | Torii | |
| 2007/0017445 A1 | 1/2007 | Takehara et al. | |
| 2008/0203531 A1 | 8/2008 | Imai et al. | |

FOREIGN PATENT DOCUMENTS

| | | |
|---|---|---|
| JP | 2003-218214 A | 7/2003 |
| JP | 2005-142337 A | 6/2005 |
| JP | 2006-319174 A | 11/2006 |
| JP | 2007-23380 A | 2/2007 |
| JP | 2008-210996 A | 9/2008 |

* cited by examiner

*Primary Examiner* — Hsien Ming Lee
(74) *Attorney, Agent, or Firm* — Miles & Stockbridge P.C.

(57) ABSTRACT

The present invention provides a technology capable of providing a semiconductor device having an MIM structure capacitor with improved reliability. The capacitor has a lower electrode, a capacitor insulating film, and an upper electrode. The lower electrode is comprised of a metal film embedded in an electrode groove formed in an insulating film over the main surface of a semiconductor substrate; and the upper electrode is comprised of a film stack of a TiN film (lower metal film) and a Ti film (cap metal film) formed over the TiN film (lower metal film).

18 Claims, 11 Drawing Sheets

SEMICONDUCTOR DEVICE

CROSS-REFERENCE TO RELATED APPLICATIONS

The disclosure of Japanese Patent Application No. 2009-295242 filed on Dec. 25, 2009 including the specification, drawings and abstract is incorporated herein by reference in its entirety.

BACKGROUND OF THE INVENTION

The present invention relates to a semiconductor device, particularly to a technology effective when applied to a semiconductor device having a capacitor having an MIM (metal insulator metal) structure.

For example, Japanese Patent Laid-Open No. 2003-218214 (Patent Document 1) discloses a semiconductor device having an MIM capacitor equipped with a lower electrode, a capacitor insulating film, and an upper electrode. The upper electrode has a polycrystalline structure and is comprised of a film stack obtained by stacking at least two conductive film layers different in crystal grain shape.

Japanese Patent Laid-Open No. 2008-210996 (Patent Document 2) discloses a technology of controlling the thickness of an upper-level barrier film provided over a lower electrode, which configures a capacitor and is made of a metal material, to 110 nm or greater, thereby preventing a reduction in dielectric breakdown of a capacitor insulating film due to cracks of the upper-level barrier film.

Japanese Patent Laid-Open No. 2007-23380 (Patent Document 3) discloses a method of, in a substrate processing system, depositing one or more silicon-containing layers on a substrate in a chemical vapor deposition chamber, transferring the substrate without breaking the vacuum, and depositing one or more metal-containing layers on the surface of the silicon-containing layer in a physical vapor deposition chamber.

Japanese Patent Laid-Open No. 2005-142337 (Patent Document 4) discloses an MIM structure capacitor having, over the upper electrode thereof, an antioxidant film.

Japanese Patent Laid-Open No. 2006-319174 (Patent Document 5) discloses an MIM structure capacitor having a lower electrode formed in an electrode trench of an interlayer insulating film, a dielectric film formed over the lower electrode, and an upper electrode formed over the dielectric film. The upper electrode and the dielectric film have a greater area than the lower electrode and the entirety of the lower electrode is placed inside the upper electrode and the dielectric film.

[Patent Document 1] Japanese Patent Laid-Open No. 2003-218214
[Patent Document 2] Japanese Patent Laid-Open No. 2008-210996
[Patent Document 3] Japanese Patent Laid-Open No. 2007-23380
[Patent Document 4] Japanese Patent Laid-Open No. 2005-142337
[Patent Document 5] Japanese Patent Laid-Open No. 2006-319174

SUMMARY OF THE INVENTION

In order to satisfy the need for an LSI (large scale integration) system having higher speed performance and lower power consumption, MIM structure capacitors capable of reducing parasitic resistance and parasitic capacitance have recently been used in semiconductor devices.

MIM structure capacitors however have various technical problems which will hereinafter be described.

MIM structure capacitors each has a lower electrode made of a metal film, a capacitor insulating film formed over the lower electrode, and an upper electrode made of a metal film formed over the capacitor insulating film. The present inventors produce an MIM structure capacitor using a TiN (titanium nitride) film formed, for example, by sputtering as the upper electrode, a W (tungsten) film formed, for example, by CVD (chemical vapor deposition) as the lower electrode, and a silicon nitride film formed, for example, by plasma CVD as the capacitor insulating film.

It has been elucidated that when a plurality of MIM structure capacitors are produced and left to stand at room temperature in the atmosphere, some of them undergo an increase in their leakage current, depending on the exposure time. Just after production, the capacitors each has a leakage current of $1\times10^{-11}$ A or less and there occurs no problem. When they are left to stand, for example, for 100 hours, their leakage current varies within a range of from $1\times10^{-12}$ A to $1\times10^{-7}$ A and when they are left to stand for 200 hours, their leakage current varies within a range of from $1\times10^{-12}$ A to $1\times10^{-5}$ A. With an increase in the exposure time, the leakage current becomes greater and varies more greatly.

An object of the invention is to provide, in a semiconductor device having an MIM structure capacitor, a technology capable of improving the reliability of a capacitor.

The above and the other objects, and novel features of the invention will be apparent from the description herein and accompanying drawings.

Of the inventions disclosed in the present application, typical ones will next be described briefly.

In one aspect of the invention, there is provided a semiconductor device having an MIM structure capacitor comprised of a lower electrode formed over the main surface of a semiconductor substrate, a capacitor insulating film formed over the lower electrode, and an upper electrode formed over the capacitor insulating film. The lower electrode is comprised of a W film embedded in an electrode groove formed in an insulating film over the main surface of the semiconductor substrate, and the upper electrode is comprised of a stack of a TiN film and a Ti film formed over the Ti film.

In another aspect of the invention, there is also provided a semiconductor device having an MIM structure capacitor comprised of a lower electrode formed over the main surface of a semiconductor substrate, a capacitor insulating film formed over the lower electrode, and an upper electrode formed over the capacitor insulating film. The lower electrode is comprised of a W film embedded in an electrode groove formed in an insulating film over the main surface of the semiconductor substrate, and the upper electrode is comprised of a film stack obtained by sequentially depositing a TiN film, a Ti film, and a TiN film without exposing them to the atmosphere.

In a further aspect of the invention, there is also provided a semiconductor device having an MIM structure capacitor comprised of a lower electrode formed over the main surface of a semiconductor substrate, a capacitor insulating film formed over the lower electrode, and an upper electrode formed over the capacitor insulating film. The lower electrode is comprised of a W film embedded in an electrode groove formed in an insulating film over the main surface of the semiconductor substrate and the electrode groove has, on the upper portion of the side surface thereof, an inclination.

An advantage available from the typical invention, of the inventions disclosed in the present application, will next be described briefly.

It is possible to provide a semiconductor device having an MIM structure capacitor with improved reliability by preventing deterioration of a capacitor insulating film which will otherwise occur due to stress variations due to oxidation of an upper electrode.

DETAILED DESCRIPTION OF THE PREFERRED EMBODIMENTS

In the below-described embodiments, a description will be made after divided in plural sections or in plural embodiments if necessary for convenience's sake. These plural sections or embodiments are not independent each other, but in a relation such that one is a modification example, details, or a complementary description of a part or whole of the other one unless otherwise specifically indicated.

In the below-described embodiments, when a reference is made to the number of elements (including the number, value, amount, and range), the number of elements is not limited to a specific number but can be greater than or less than the specific number unless otherwise specifically indicated or principally apparent that the number is limited to the specific number. Moreover in the below-described embodiments, it is needless to say that the constituting elements (including element steps) are not always essential unless otherwise specifically indicated or principally apparent that they are essential. Similarly, in the below-described embodiments, when a reference is made to the shape, positional relationship, or the like of the constituting elements, that substantially analogous or similar to it is also embraced unless otherwise specifically indicated or different in principle. This also applies to the above-described value and range.

In the drawings used in the following embodiments, some plan views may be hatched in order to facilitate viewing of them. In the below-described embodiments, MISFET (metal insulator semiconductor field effect transistor) representative of field effect transistors is abbreviated as MIS, p-channel MISFET is abbreviated as pMIS, and n channel MISFET is abbreviated as nMIS. The term "metal" embraces not only metals but also conductive films such as polycrystalline silicon. In the below-described embodiments, the term "wafer" mainly means an Si (silicon) single crystal wafer, but it also means an SOI (silicon on insulator) wafer, an insulating film substrate for forming an integrated circuit thereover, or the like. The shape of the wafer is not limited to disc or substantially disc, but it may be square or rectangular. In the below-described embodiments, it is needless to say that the term "silicon nitride film" means not only an insulating film having a stoichiometric composition ($Si_3N_4$) but also an insulating film containing a nitride of silicon having a similar composition thereto; and the term "silicon oxide film" means not only an insulating film having a stoichiometric composition ($SiO_2$) but also an insulating film containing an oxide of silicon having a similar composition thereto.

In all the drawings for describing the below-described embodiments, members having like function will be identified by like reference numerals and overlapping descriptions will be omitted. The embodiments of the present invention will hereinafter be described specifically referring to accompanying drawings.

Figure 1:
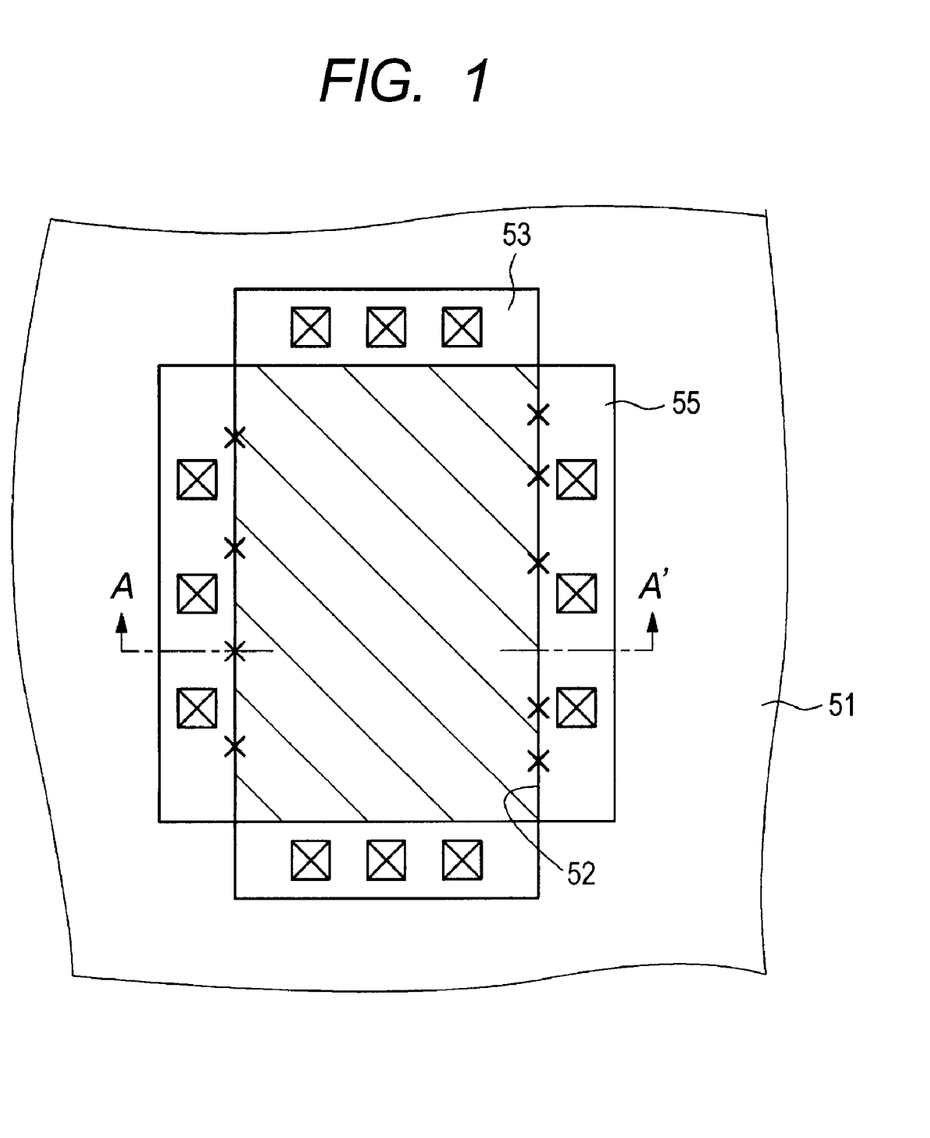
FIG. 1 is a fragmentary plan view of an MIM structure capacitor investigated by the present inventors.
Figure 2:
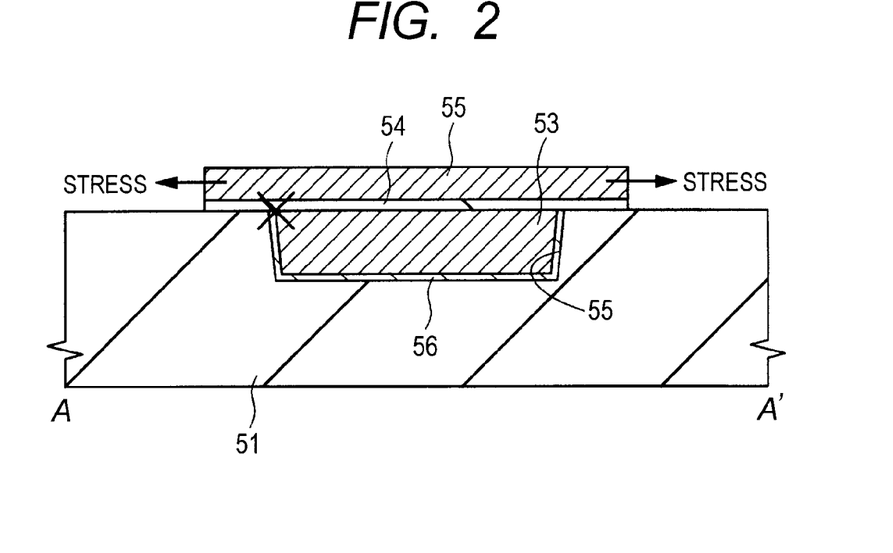
FIG. 2 is a fragmentary cross-sectional view taken along a line A-A' of FIG. 1.
Figure 3:
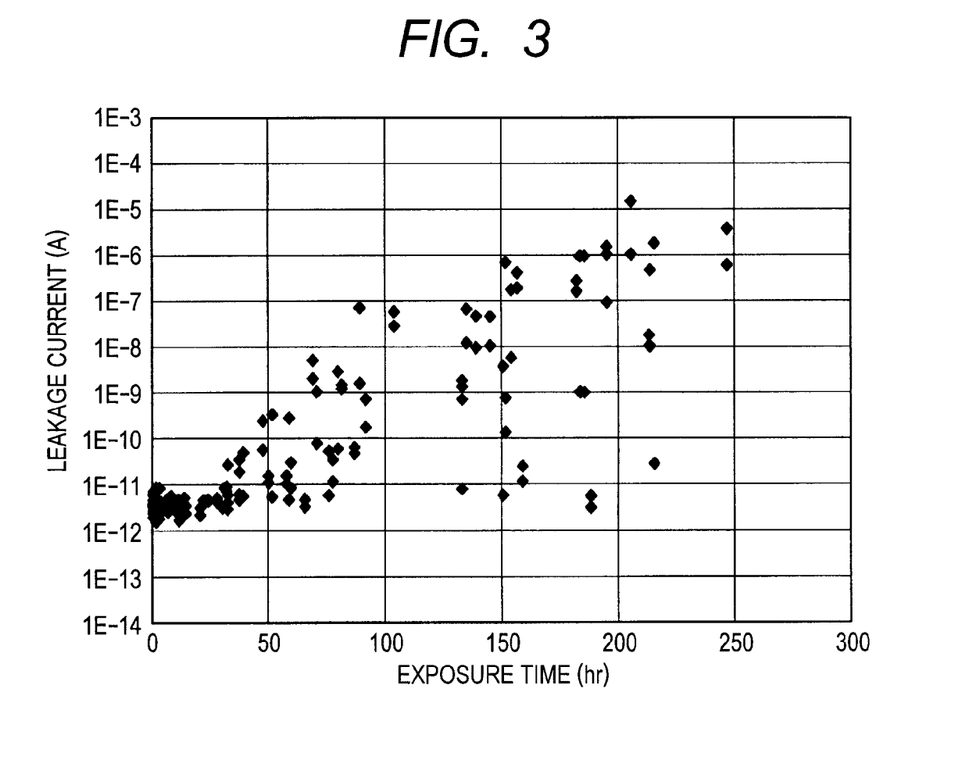
FIG. 3 is a graph showing the relationship between a leakage current and an exposure time, which relationship is obtained from a plurality of the MIM structure capacitors investigated by the present inventors.
Figure 4:
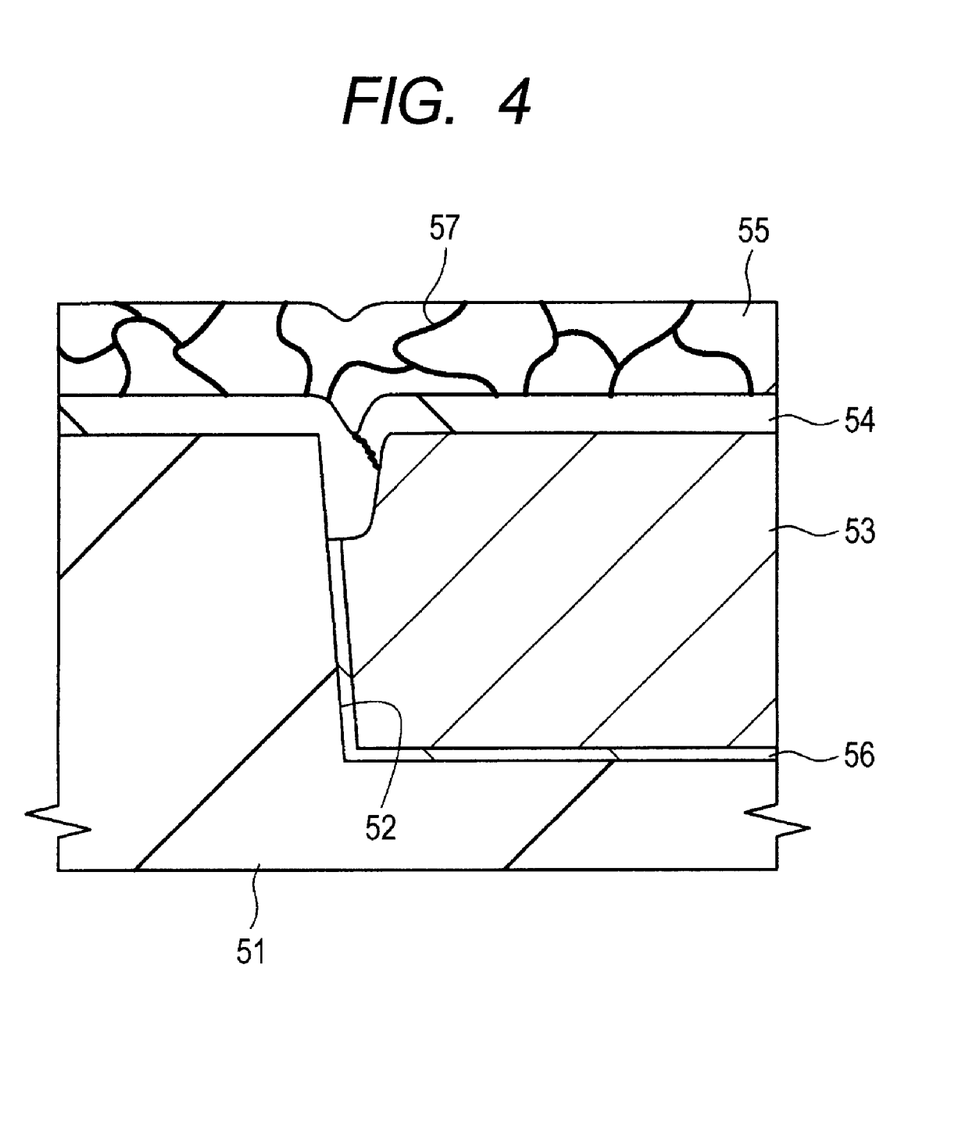
FIG. 4 is a schematic view illustrating a partially-enlarged cross-section of the MIM structure capacitor having an increased leakage current.

First, causes of a leakage current that occurs in an MIM structure capacitor investigated by the present inventors prior to the present invention will next be described referring to FIGS. 1 to 4 in order to make clear the MIM structure capacitor according to the present embodiment by comparison. FIG. 1 is a fragmentary plan view of the MIM structure capacitor investigated by the present inventors; FIG. 2 is a fragmentary cross-sectional view taken along a line A-A' of FIG. 1; FIG. 3 is a graph showing the relationship between a leakage current and an exposure time, which relationship is obtained from a plurality of the MIM structure capacitors investigated by the present inventors; and FIG. 4 is a schematic view illustrating a partially-enlarged cross-section of the MIM structure capacitor having an increased leakage current.

As illustrated in FIGS. 1 and 2, the MIM structure capacitor is comprised of a lower electrode 53 made of a W film embedded in an electrode groove 52 formed in an insulating film 51, a capacitor insulating film 54 made of a silicon nitride film formed over the lower electrode 53, and an upper electrode 55 made of a TiN film formed over the capacitor insulating film 54. A portion of the lower electrode 53 is laid over the insulating film 51 in order to provide a portion necessary for electrical extraction.

The W film is formed, for example, by CVD using a $WF_6$ (tungsten hexafluoride) gas, the silicon nitride film is formed, for example, by plasma CVD, and the TiN film is formed, for example, by sputtering. Between the insulating film 51 and the lower electrode 53, there is formed a barrier metal film 56 obtained by sequentially stacking a Ti (titanium) film and a TiN film in the order of mention for the purpose of preventing diffusion of W from the $WF_6$ gas, which is used upon formation of the lower electrode 53, and to prevent separation of the W film configuring the lower electrode 53.

When as described above, the MIM structure capacitors are left to stand at room temperature in the atmosphere after production, some MIM structure capacitors have a gradually increased leakage current with the passage of an exposure time. It has been found from the analysis of the MIM structure capacitors showing an increased leakage current that deterioration of the capacitor insulating film 54 has occurred at the end portion (upper portion of the side surface of the electrode groove 52 marked with "x" in FIGS. 1 and 2) of the lower electrode 53 that does not run on the insulating film 51 and is covered with the upper electrode 55.

FIG. 3 shows the relationship between a leakage current and an exposure time, which relationship is obtained from a plurality of the MIM structure capacitors. The capacitor insulating film (silicon nitride film) has a thickness of 39 nm (in terms of the thickness of an $SiO_2$ film in consideration of a dielectric constant) and the upper electrode (TiN film) has a thickness of 50 nm. A voltage of 3.6 V is applied between the upper electrode and the lower electrode.

Immediately after production, all the MIM structure capacitors have a leakage current of $1 \times 10^{-11}$ A or less. When the exposure time exceeds 24 hours, however, some MIM structure capacitors have an increased leakage current. When the exposure time exceeds 100 hours, the leakage current of the MIM structure capacitors varies within a range of $1 \times 10^{-12}$ A to $1 \times 10^{-5}$ A.

The present inventors carried out emission analysis, TEM (transmission electron microscope) analysis, stress analysis through simulation, and the like of the MIM structure capacitors having an increased leakage current. Analysis results of them have revealed the phenomenon described below.

As illustrated in FIG. 4, from the MIM structure capacitors having an increased leakage current, oxygen is detected along the grain boundary 57 of the TiN film configuring the upper electrode 55. The TiN film has a columnar crystal structure and has a relatively large crystal grain size. It is therefore presumed that atmospheric oxygen therefore easily penetrates along the grain boundary 57 of the TiN film and causes oxidation of the upper electrode 55. In addition, it has been found from the analysis results through simulation that as oxidation of the upper electrode 55 progresses, stress (compressive stress) concentration occurs at the end portion of lower electrode 53 covered with the upper electrode 55 and in order to alleviate this compressive stress, a stress acts on the capacitor insulating film 54 in a tensile direction (an arrow direction shown in FIG. 2).

The W film configuring the lower electrode 53 is embedded in the electrode groove 52 formed in the insulating film 51. In order to form this lower electrode 53, first a barrier metal film 56 is formed in the electrode groove 52 formed in the insulating film 51. The barrier metal film 56 is, for example, a film stack obtained by sequentially depositing a Ti film and a TiN film in the order of mention by sputtering and it has a thickness of, for example, from about 3 to 5 nm. Then, a W film is deposited by CVD. The electrode groove 52 is completely filled with the W film. Then, the W film and the barrier metal film 56 outside the electrode groove 52 are removed by CMP (chemical mechanical polishing).

When the CMP is performed, a slurry is likely to remain at the upper portion of the side surface of the electrode groove 52. A polishing rate increases at this site and a portion of the W film and the barrier metal film 56 is sometimes etched more deeply than the other portion of these films by about several nm. In addition, after the CMP, washing for removing the slurry may etch the exposed barrier metal film 56. The capacitor insulating film 54 to be formed over the lower electrode 53 is then deposited along the etched shape of the W film or the barrier metal film 56. As a result, the capacitor insulating film 54 may have a recess, that is, a concave portion at the upper portion of the side surface of the electrode groove 52.

It is presumed that the tensile stress acting on the capacitor insulating film 54 as described above is therefore mainly exerted on the portion of the capacitor insulating film 54 present at the upper portion of the side surface of the electrode groove 52 and more concave than the other portion and at the upper portion, deterioration of the capacitor insulating film 54 occurs, leading to an increase in the leakage current of the MIM structure capacitor. The deterioration of the capacitor insulating film 54 can be prevented by increasing the thickness of the capacitor insulating film 54 deposited on the lower electrode 53 to be more than 40 nm (in terms of the thickness of an $SiO_2$ film in consideration of a dielectric constant), which is greater than the current thickness (39 nm) (in terms of the thickness of an $SiO_2$ film in consideration of a dielectric constant). An increase in the thickness of the capacitor insulating film 54 however causes a drawback, that is, a decrease in the capacitance.

The capacitor according to the invention therefore has improved reliability by employing an MIM structure capable of suppressing oxidation of the upper electrode 55 or preventing deterioration of the capacitor insulating film 54 which will otherwise occur due to stress variations of the lower electrode 53.

Embodiment 1

Figure 5:
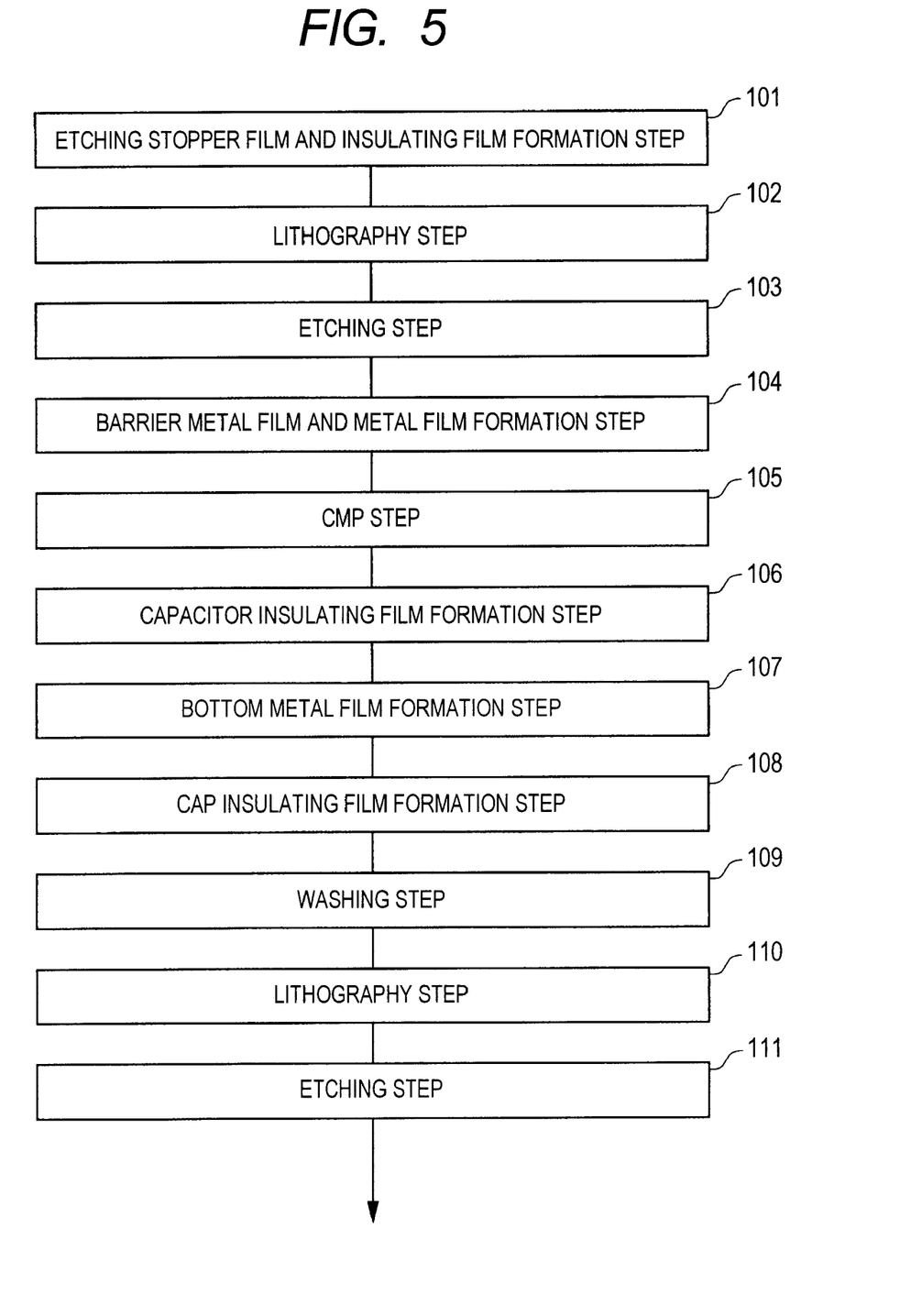
FIG. 5 is a step flow chart showing one example of manufacturing steps of an MIM structure capacitor according to Embodiment 1 of the invention.

A semiconductor device having an MIM structure capacitor according to Embodiment 1 will next be described based on its manufacturing method. FIG. 5 is a step flow chart showing one example of the manufacturing steps of the MIM structure capacitor, FIGS. 6 to 10, FIG. 12, and FIG. 13 are fragmentary cross-sectional views of the semiconductor device, and FIG. 11 is a graph for describing the distribution of a leakage current of the MIM structure capacitor. Although various semiconductor elements are formed in a semiconductor device, a CMOS (complementary metal oxide semiconductor) device and an MIM structure capacitor are given as examples of them.

Figure 6:
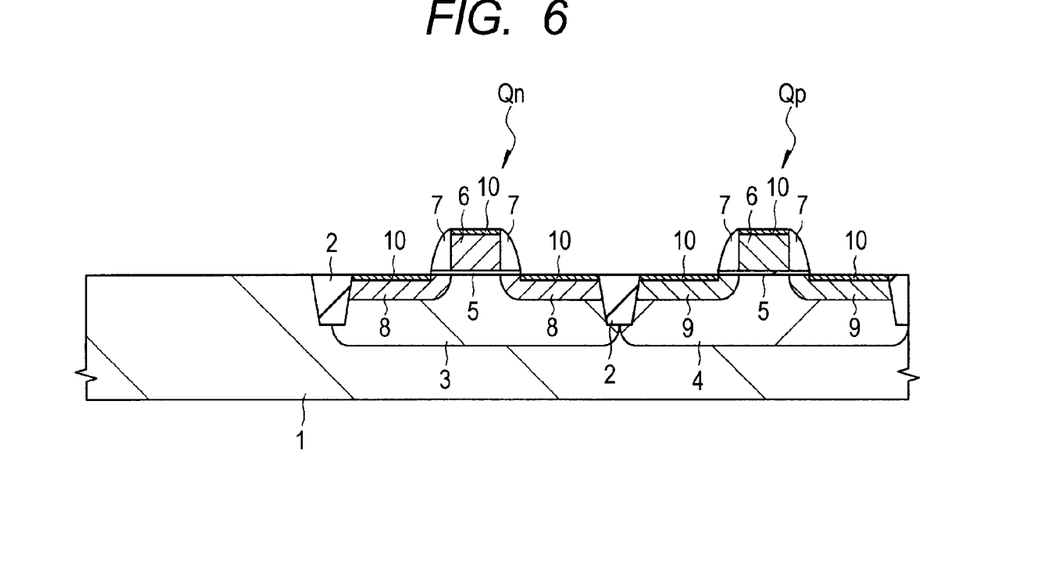
FIG. 6 is a fragmentary cross-sectional view showing a manufacturing method of a semiconductor device having the MIM structure capacitor according to Embodiment 1 of the present invention.

First, as illustrated in FIG. 6, an nMIS (Qn) and a pMIS (Qp) are formed over the main surface of a semiconductor substrate (semiconductor wafer processed into a thin disc-shaped sheet) 1 made of, for example, single crystal silicon. In the drawing, an element isolation region is indicated by the number 2, a p well by the number 3, and an n well by the number 4. The element isolation region 2 is formed by embedding an insulating film in a groove formed in the semiconductor substrate 1. The p well 3 is formed by implanting a p type impurity (for example, boron) into the semiconductor substrate 1 and heat treating the semiconductor substrate 1 to activate the p type impurity. The n well 4 is formed by implanting an n type impurity (for example, phosphorus) into the semiconductor substrate 1 and then heat treating the semiconductor substrate 1 to activate the n type impurity.

The nMIS (Qn) is comprised of a gate insulating film 5 formed over the surface of the p well 3, a gate electrode 6 formed over the gate insulating film 5, sidewalls 7 formed on the side walls of the gate electrode 6, a pair of n type semiconductor regions (source and drain) 8 formed in the p well 3 on both sides of the gate electrode 6, and the like. Similarly, the pMIS (Qp) is comprised of a gate insulating film 5 formed over the surface of the n well 4, a gate electrode 6 formed over the gate insulating film 5, sidewalls 7 formed on the side walls of the gate electrode 6, a pair of p type semiconductor regions (source and drain) 8 formed in the n well 4 on both sides of the gate electrode 6. The gate insulating film 5 is made of, for example, a silicon oxide film or a silicon oxynitride film. The gate electrode 6 of the nMIS (Qn) is made of, for example, a polycrystalline silicon film having an n type impurity (for example, phosphorus) introduced therein, while the gate electrode 6 of the pMIS (Qp) is made of a polycrystalline silicon film having a p type impurity (for example, boron) introduced therein. The sidewalls 7 are made of, for example, a silicon nitride film.

A silicide film 10 made of, for example, CoSi (cobalt silicide) is formed over each of the surfaces of the gate electrode 6 and the n type semiconductor regions 8 of the nMIS (Qn) and each of the surfaces of the gate electrode 6 and the p type semiconductor regions 9 of the pMIS (Qp).

Figure 7:
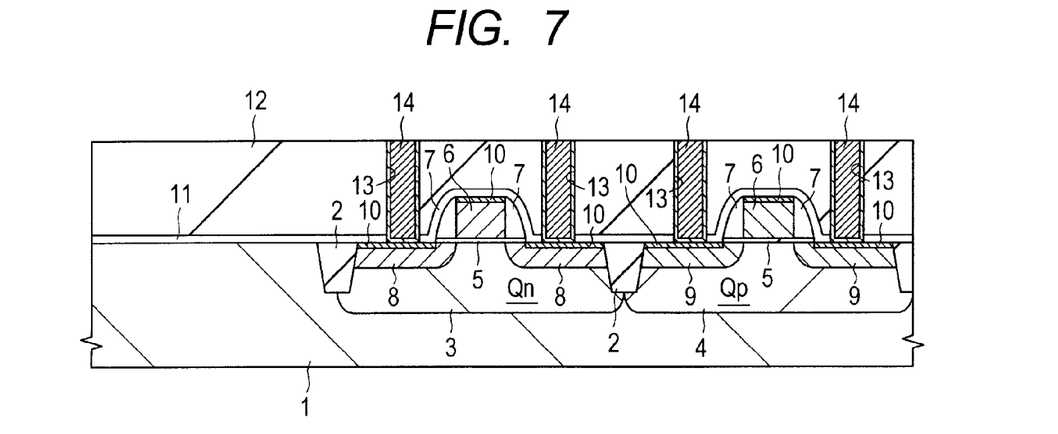
FIG. 7 is a fragmentary cross-sectional view illustrating a portion similar to that of FIG. 6 during a manufacturing step of the semiconductor device following that of FIG. 6.

As illustrated in FIG. 7, after an etching stopper film 11 and an insulating film 12 are deposited sequentially over the main surface of the semiconductor substrate 1 by CVD, the surface of the insulating film 12 is planarized using CMP. The etching stopper film 11 is made of, for example, a silicon nitride film and the insulating film 12 is made of, for example, a silicon oxide film. With a resist pattern as a mask, the insulating film 12 and the etching stopper film 11 are then etched sequentially to form a connecting hole 13 reaching the n type semiconductor regions 8 of the nMIS (Qn) and the p type semiconductor regions 9 of the pMIS (Qp). A plug 14 is then formed in the connecting hole 13. The plug 14 is comprised of, for example, a film stack obtained by sequentially depositing a TiN film (or a stack of a Ti film and a TiN film) and a W film.

Figure 8:
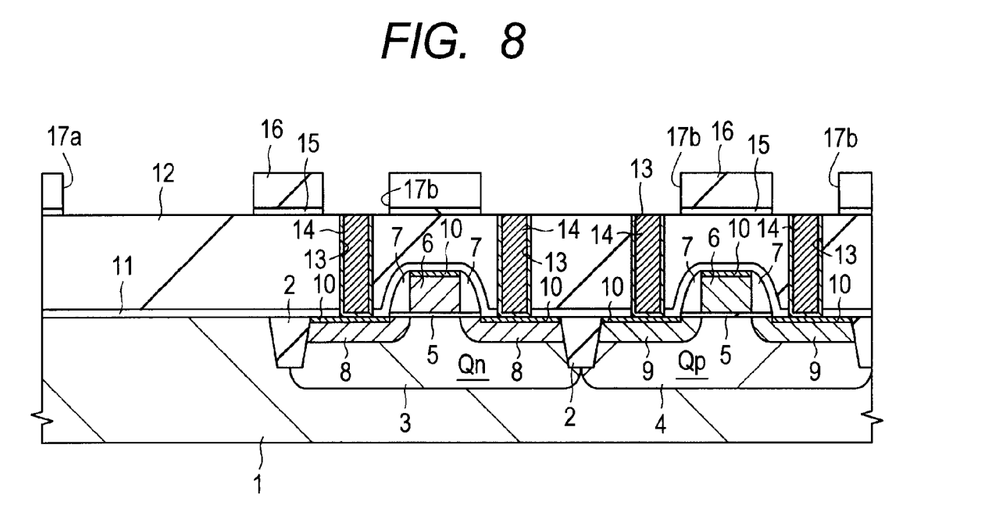
FIG. 8 is a fragmentary cross-sectional view illustrating a portion similar to that of FIG. 6 during a manufacturing step of the semiconductor device following that of FIG. 7.

As illustrated in FIG. 8, an etching stopper film 15 and an insulating film 16 are then deposited sequentially over the main surface of the semiconductor substrate 1 by plasma CVD (Step 101 of FIG. 5). The etching stopper film 15 is made of, for example, a silicon nitride film and the insulating film 16 is made of, for example, a silicon oxide film. With a resist pattern as a mask, the insulating film 16 and the etching stopper film 15 are then etched sequentially to form an electrode groove 17a in the formation region of the capacitor (Steps 102 and 103 of FIG. 5) and an interconnect groove 17b reaching the plug 14. The plug 14 is exposed from the bottom of the interconnect groove 17b.

Figure 9:
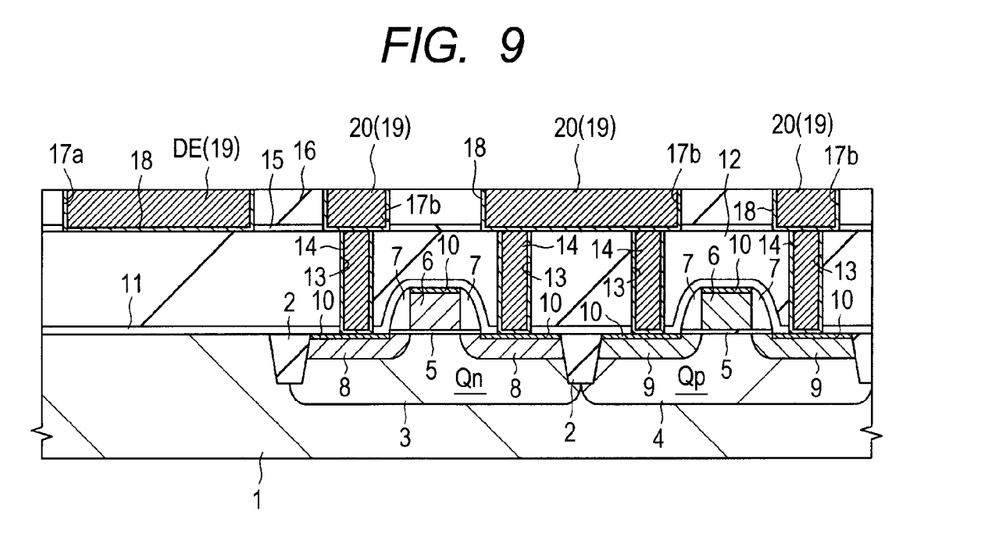
FIG. 9 is a fragmentary cross-sectional view illustrating a portion similar to that of FIG. 6 during a manufacturing step of the semiconductor device following that of FIG. 8.

As illustrated in FIG. 9, a lower electrode DE of the capacitor and a first-level interconnect 20 are then formed. First, a barrier metal film 18 and a metal film 19 are sequentially deposited over the main surface of the semiconductor substrate 1 to completely embed them in the electrode groove 17a and the interconnect groove 17b (Step 104 of FIG. 5). The barrier metal film 18 is made of, for example, a film stack obtained by sequentially stacking a Ti film and a TiN film in the order of mention by sputtering and the metal film 19 is made of, for example, a W film deposited by CVD. Subsequently, the metal film 19 and the barrier metal film 18 outside the electrode groove 17a and the interconnect groove 17b are removed by CMP. As a result, the lower electrode DE having the metal film 19 as a principal material is formed in the electrode groove 17a (Step 105 of FIG. 5) and the first-level interconnect 20 having the metal film 19 as a principal material is formed in the electrode groove 17b. Thus, the lower electrode DE of the capacitor is formed by the damascene process in Embodiment 1.

Figure 10:
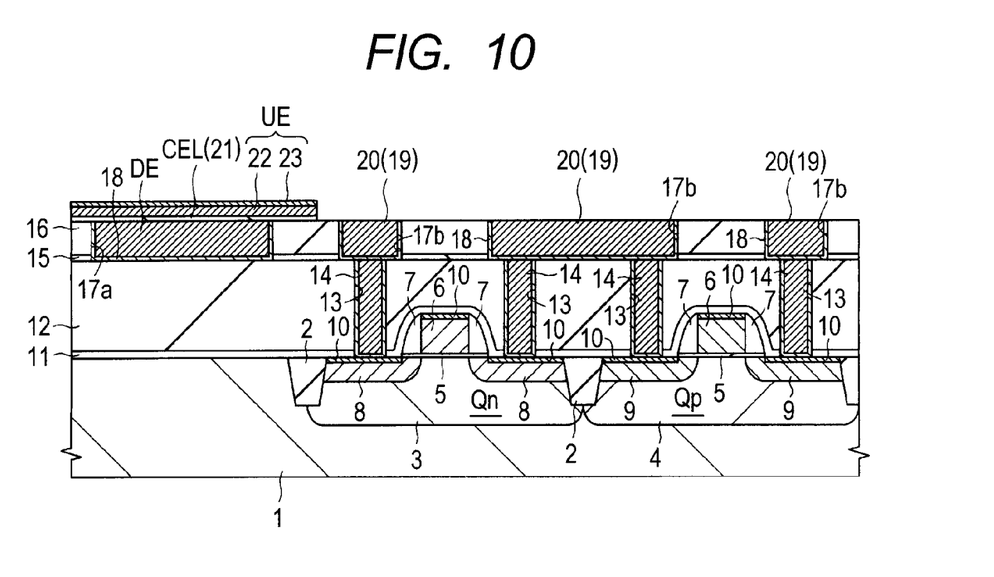
FIG. 10 is a fragmentary cross-sectional view illustrating a portion similar to that of FIG. 6 during a manufacturing step of the semiconductor device following that of FIG. 9.
Figure 11:
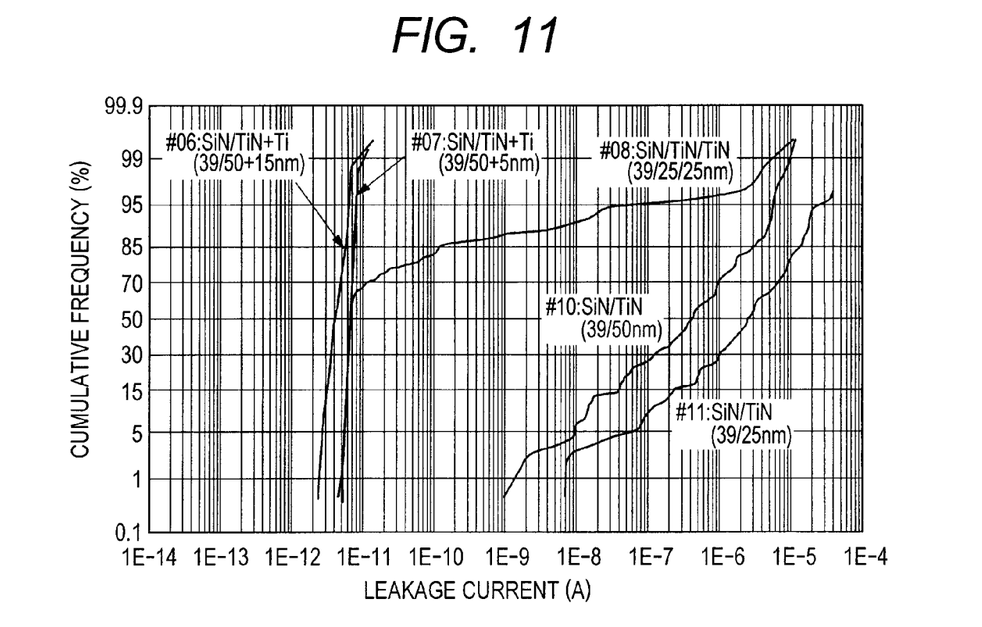
FIG. 11 is a graph for describing the distribution of a leakage current of the MIM structure capacitor according to Embodiment 1 of the invention.

As illustrated in FIG. 10, a capacitor insulating film CEL and an upper electrode UE are then formed sequentially over the lower electrode DE. First, an insulating film 21 is formed over the main surface of the semiconductor substrate 1 (Step 106 of FIG. 5). The insulating film 21 is, for example, a silicon nitride film formed by sputtering and it has a thickness of, for example, 39 nm (in terms of the thickness of an $SiO_2$ film in consideration of a dielectric constant). A lower metal film and a cap metal film are deposited sequentially of the main surface (over the insulating film 21) of the semiconductor substrate 1 (Steps 107 and 108 of FIG. 5). The lower metal film is, for example, a TiN film 22 formed by sputtering and it has a thickness of, for example, 50 nm. The cap metal film is, for example, a Ti film 23 formed, for example, by sputtering and it has a thickness of, for example, from 5 to 15 nm. The TiN film 22 serving as the lower metal film and the Ti film 23 serving as the cap metal film are formed sequentially by sputtering without exposing them to the atmosphere in order to prevent oxidation of the TiN film 22 and improve the adhesion between the TiN film 22 and the Ti film 23.

After washing the upper surface of the Ti film 23 (Step 109 of FIG. 5), the Ti film 23, the TiN film 22, and the insulating film 21 are etched sequentially with a resist pattern as a mask to form the capacitor insulating film CEL made of the insulating film 21 and the upper electrode UE made of a stack of the TiN film 22 and the Ti film 23 (Steps 110 and 111 of FIG. 5).

FIG. 11 is a graph for describing the distribution of a leakage current of each of MIM structure capacitors measured after leaving them at room temperature for 557 hours, after production, in the atmosphere. FIG. 11 shows variations in a leakage current of capacitors (#08, #10, and #11) having an upper electrode UE composed solely of a TiN film and capacitors (#06 and #07) having an upper electrode UE comprised of a TiN/Ti film stack. The upper electrode UE of the capacitor (#08) is comprised of a film stack obtained by stacking two layers of a TiN film of 25 nm thick; the upper electrode UE of the capacitor (#10) is comprised of a TiN film of 50 nm thick; the upper electrode UE of the capacitor (#11) is comprised of a TiN film of 25 nm thick; the upper electrode UE of the capacitor (#06) is comprised of a stack of a TiN film of 50 nm thick and a Ti film of 15 nm thick; and the upper electrode UE of the capacitor (#07) is comprised of a stack of a TiN film of 50 nm thick and a Ti film of 5 nm thick. All the capacitors (#06, #07, #08, #10, and #11) use a silicon nitride film of 39 nm thick (in terms of the thickness of an $SiO_2$ film in consideration of a dielectric constant) for their capacitor insulating film CEL.

As illustrated in FIG. 11, the capacitors (#08, #10, and #11) having an upper electrode UE composed solely of a TiN film or comprised of a film stack with the TiN film have a leakage current in a range of from $5 \times 10^{-12}$ A to $5 \times 10^{-5}$ A and many capacitors show an increase in the leakage current. On the other hand, the capacitors (#06 and #07) having an upper electrode comprised of a TiN/Ti film stack have a leakage current of $2\times10^{-11}$ A or less, showing no increase in leakage current.

This means that an increase in the leakage current can be suppressed by stacking the Ti film 23 over the TiN film 22. This effect is presumed to be produced because a TiO film formed as a result of a reaction of atmospheric oxygen with the Ti film 23 prevents penetration of the atmospheric oxygen into the TiN film 22 and oxidation of the TiN film 22 along the grain boundary is suppressed. Since the oxidation of the TiN film 22 does not proceed, a stress on the capacitor insulating film CEL in a tensile direction is alleviated and deterioration of the capacitor insulating film CEL can be prevented.

The present inventors investigated an upper electrode UE comprised of two layers of the TiN film of 25 nm thick, thinking that since the TiN film has a columnar crystal structure, two layers of the TiN film stacked one after another can prevent penetration of atmospheric oxygen at the boundary between the upper TiN film and the lower TiN film. A capacitor using this upper electrode UE does not succeed in decreasing the leakage current as shown in the capacitor (#08) in FIG. 11 so that deterioration of the capacitor insulating film CEL cannot be prevented.

Figure 12:
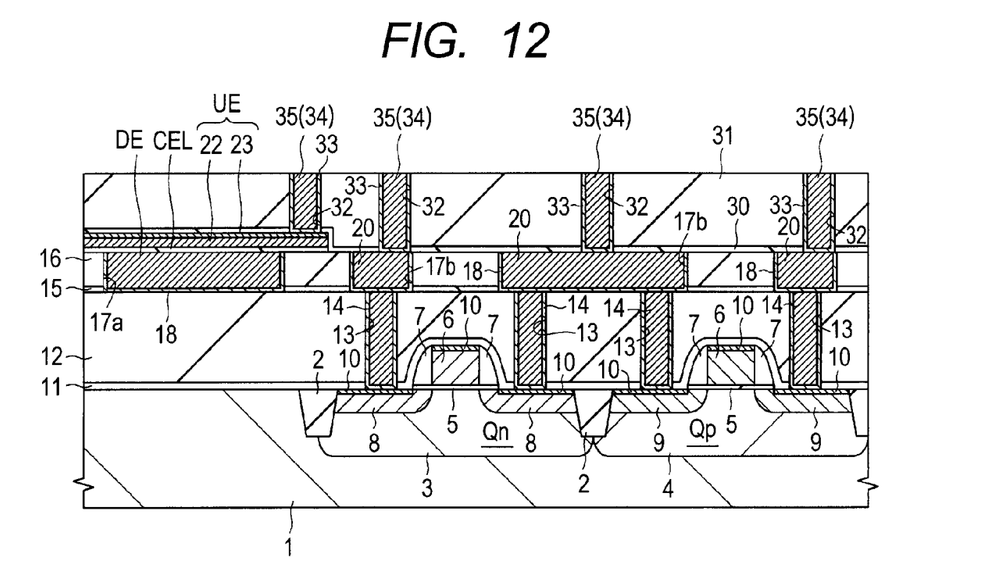
FIG. 12 is a fragmentary cross-sectional view illustrating a portion similar to that of FIG. 6 during a manufacturing step of the semiconductor device following that of FIG. 10.

As illustrated in FIG. 12, an etching stopper film 30 and an insulating film 31 are deposited sequentially over the main surface of the semiconductor substrate 1 by plasma CVD. The etching stopper film 30 is made of, for example, a silicon nitride film and the insulating film 31 is made of, for example, a silicon oxide film. With a resist pattern as a mask, the insulating film 31 and the etching stopper film 30 are etched sequentially to form a connecting hole 32 reaching the first-level interconnect 20 simultaneously with a connecting hole 32 reaching the upper electrode UE of the capacitor and a connecting hole (not illustrated) reaching the lower electrode DE.

A barrier metal film 33 and a metal film 34 are sequentially deposited over the main surface of the semiconductor substrate 1 to completely fill therewith the connecting hole 32. The barrier metal film 33 is comprised of, for example, a film stack obtained by sequentially stacking a Ti film and a TiN film in the order of mention by sputtering and the metal film 34 is comprised of, for example, a W film. Then, the metal film 34 and the barrier metal film 33 outside the connecting hole 32 are removed by CMP, by which a plug 35 having the metal film 34 as a principal material is formed in the connecting hole 32.

Figure 13:
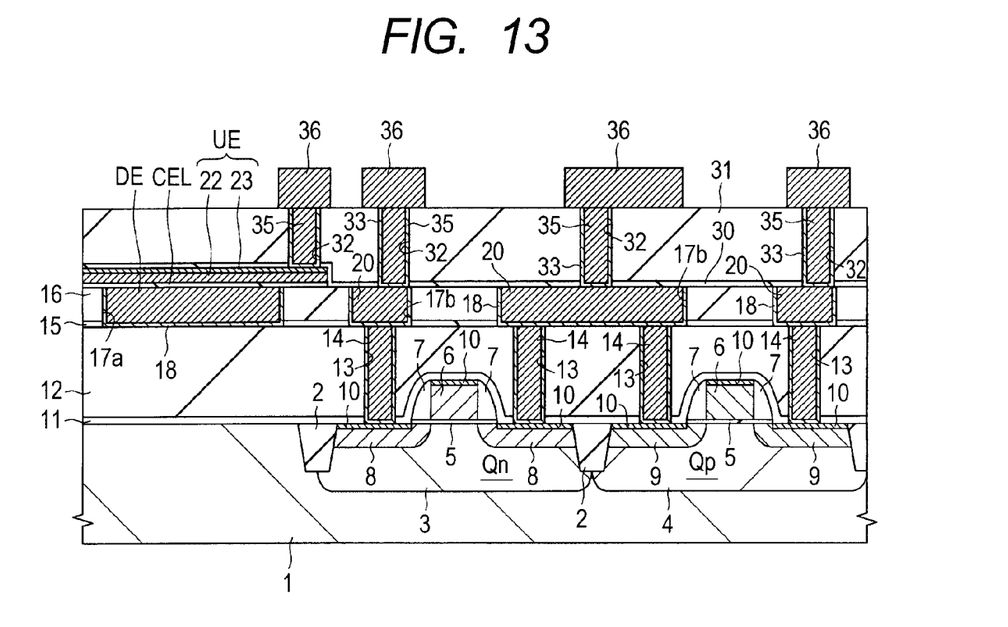
FIG. 13 is a fragmentary cross-sectional view illustrating a portion similar to that of FIG. 6 during a manufacturing step of the semiconductor device following that of FIG. 12.

As illustrated in FIG. 13, a second-level interconnect 36 to be electrically coupled to the upper electrode UE or lower electrode DE of the capacitor via the plug 35 is formed. Simultaneously, a second-level interconnect 36 to be electrically coupled to the first-level interconnect 20 via the plug 35 is also formed. Upper-level interconnects are thereafter formed and as a result, the semiconductor device having the MIM structure capacitor according to Embodiment 1 is substantially completed.

In Embodiment 1, the Ti film 23 is used as the cap metal film. The cap metal film is not limited thereto and any metal film is usable insofar as it can be oxidized by reacting with atmospheric oxygen and suppress the diffusion of the oxygen into the TiN film 22 lying below the metal film.

Thus, according to Embodiment 1, the upper electrode UE of the MIM structure capacitor is formed by stacking the cap metal film made of the Ti film 23 over the lower metal film made of the TiN film 22 so that atmospheric oxygen reacts with the Ti film 23 to form a TiO film and the resulting TiO film prevents penetration of the atmospheric oxygen into the TiN film 22. Oxidation of the TiN film 22 along the grain boundary can therefore be prevented. Since oxidation of the TiN film 22 below the Ti film 23 does not progress, stress (compressive stress) concentration does not occur at the end portion of the lower electrode DE and a tensile stress to be imposed on the capacitor insulating film CEL for reducing the compressive stress is alleviated. As a result, deterioration of the capacitor insulating film CEL can be prevented.

Embodiment 2

The semiconductor device according to Embodiment 2 of the present invention is similar to Embodiment 1 and has an MIM structure capacitor. It is however different from that of Embodiment 1 in the configuration of an upper electrode UE of the capacitor. Described specifically, the upper electrode UE described in Embodiment 1 is comprised of two metal film layers, that is, the lower metal film (TiN film 22) and the cap metal film (Ti film 23), while an upper electrode UE comprised of three metal film layers, that is a lower metal film, a cap metal film, and an upper metal film is described in Embodiment 2.

Figure 14:
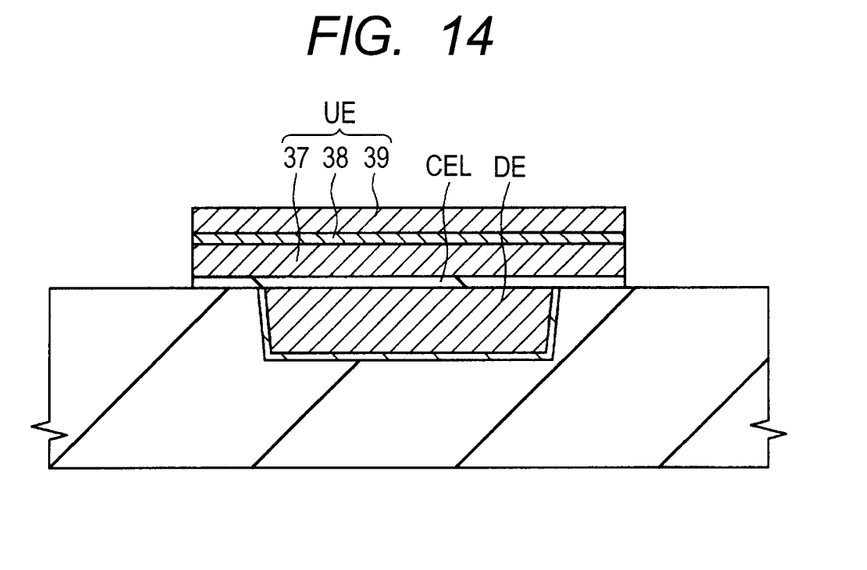
FIG. 14 is a fragmentary cross-sectional view illustrating an MIM structure capacitor according to Embodiment 2 of the invention.

The MIM structure capacitor according to Embodiment 2 will be described referring to FIG. 14. FIG. 14 is a fragmentary cross-sectional view illustrating the MIM structure capacitor. The lower electrode DE and the capacitor insulating film CEL of the MIM structure capacitor are similar in configuration to those of Embodiment 1 so that description of them is omitted.

As illustrated in FIG. 14, the upper electrode UE of the MIM structure capacitor according to Embodiment 2 is comprised of three metal film layers obtained by sequentially depositing a lower metal film, a cap metal film, and an upper metal film. The lower metal film is, for example, a lower TiN film 37 formed through sputtering using a Ti target and an $N_2$ gas and it has a thickness of, for example, from 20 to 50 nm. The cap metal film is, for example, a Ti film 38 formed through sputtering using a Ti target and an Ar gas and has a thickness of, for example, 15 nm. The upper metal film is, for example, an upper TiN film 39 formed through sputtering using a Ti target and an $N_2$ gas and has a thickness of, for example, from about 20 to 30 nm. The lower TiN film 37 serving as the lower metal film, the Ti film 38 serving as the cap metal film, and the upper TiN film 39 serving as the upper metal film are formed sequentially by sputtering without exposing them to the atmosphere in order to improve adhesion between the lower TiN film 37 and the Ti film 38 or adhesion between the Ti film 38 and the upper TiN film 39.

Figure 15:
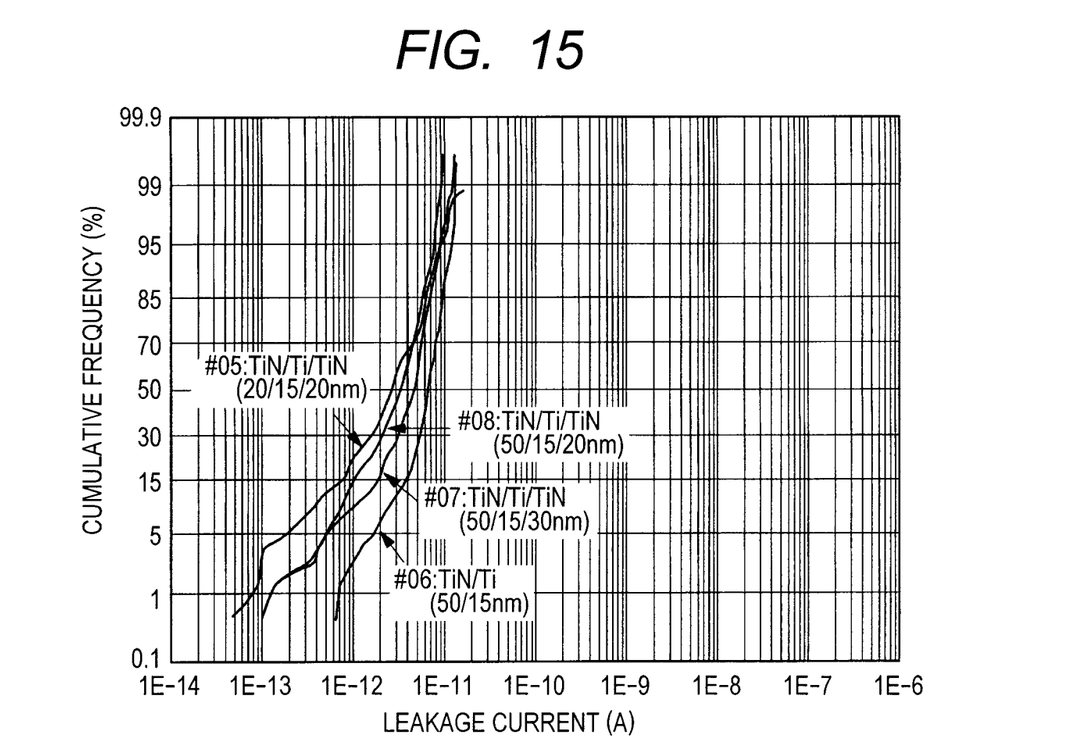
FIG. 15 is a graph for describing the distribution of a leakage current of the MIM structure capacitor according to Embodiment 2 of the invention.

FIG. 15 is a graph for describing the distribution of a leakage current measured after the MIM structure capacitor is left to stand in the atmosphere for 658 hours, after production, at room temperature. FIG. 15 shows the distribution of a leakage current of each of capacitors (#05, #07, and #08) comprised of a film stack of the upper TiN film, the Ti film, and the lower TiN film. The upper electrode UE of the capacitor (#05) is comprised of a film stack of the upper TiN film of 20 nm thick, the Ti film of 15 nm thick, and the lower TiN film of 20 nm thick; the upper electrode UE of the capacitor (#07) is comprised of a film stack of the upper TiN film of 30 nm thick, the Ti film of 15 nm thick, and the lower TiN film of 50 nm thick; and the upper electrode UE of the capacitor (#08) is comprised of a film stack of the upper TiN film of 20 nm thick, the Ti film of 15 nm thick, and the lower TiN film of 50 nm thick.

As shown in FIG. 15, the capacitors (#05, #07, and #08) having the upper electrode UE comprised of a film stack of the lower TiN film, the Ti film, and the upper TiN film have a leakage current of $2\times10^{-11}$ A or less and no marked increase in the leakage current is observed.

As described above in Embodiment 1, oxidation of the lower TiN film 37 can be prevented only by stacking the Ti film 38 over the lower TiN film 37. However, by stacking the upper TiN film 39 over the Ti film 38 further and thereby forming a TiO film due to oxidation of the upper TiN film 39 along the grain boundary and oxidation of the Ti film 38, it is possible to reduce penetration of atmospheric oxygen into the lower TiN film 37, compared with stacking of only the Ti film 38 over the lower TiN film 37. As a result, since the oxidation of the lower TiN film 37 does not progress, the advantage equal to or greater than that of Embodiment 1 can be achieved.

Embodiment 3

A semiconductor device according to Embodiment 3 of the invention is similar to that of Embodiment 1 and has an MIM structure capacitor. It is however different from that of Embodiment 1 in the shape of the electrode groove embedded with the lower electrode of the capacitor. In the capacitor described above in Embodiment 1, the upper angular portion of the electrode groove 17*a* embedded with the lower electrode DE has an angle close to 90°. In Embodiment 3, on the other hand, the capacitor has an inclination at the upper portion of the side surface of the electrode groove 17*a* embedded with the lower electrode DE.

Figure 16:
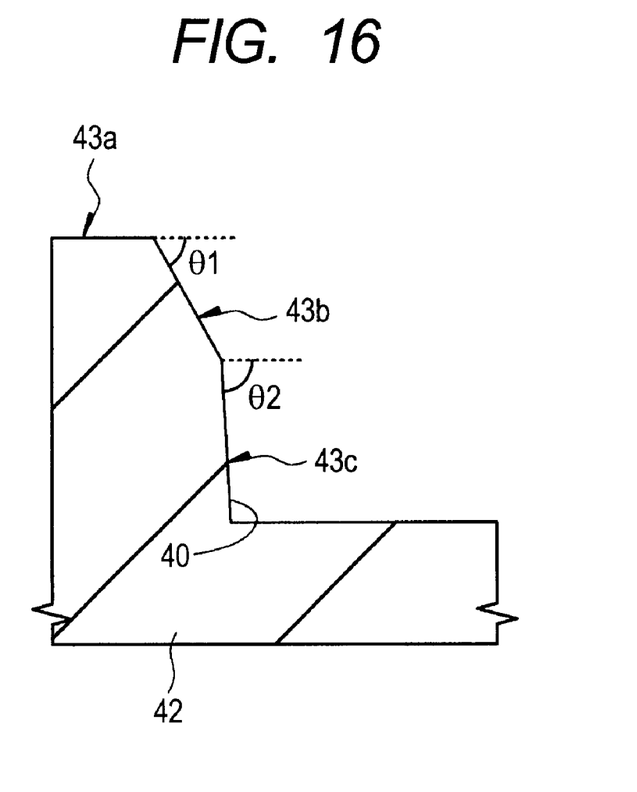
FIG. 16 is an enlarged schematic fragmentary cross-sectional view of an interconnect groove for describing the interconnect groove of an MIM structure capacitor according to Embodiment 3 of the invention.
Figure 17:
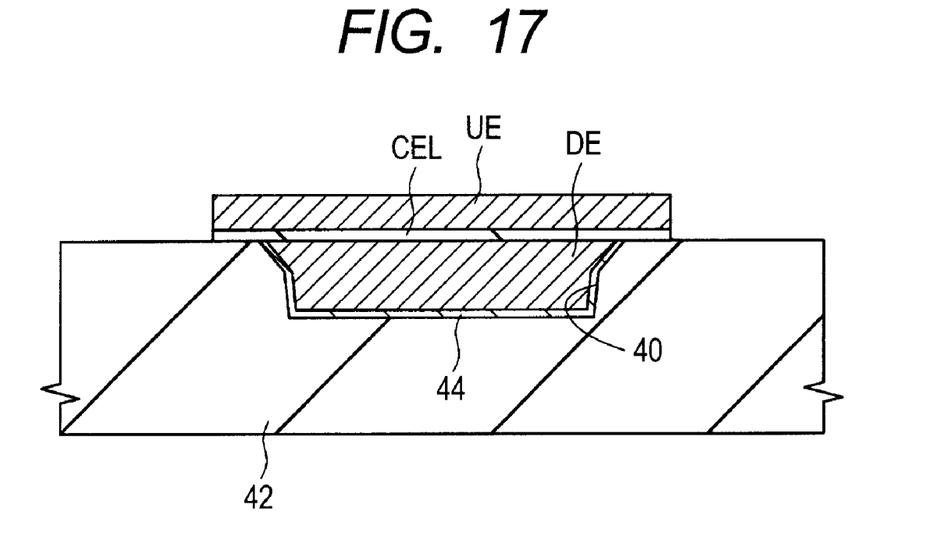
FIG. 17 is a fragmentary cross-sectional view illustrating the MIM structure capacitor according to Embodiment 3 of the invention.

The MIM structure capacitor according to Embodiment 3 will next be described referring to FIGS. 16 and 17. FIG. 16 is an enlarged schematic fragmentary cross-sectional view of an interconnect groove for describing the interconnect groove of the MIM structure capacitor and FIG. 17 is a fragmentary cross-sectional view of the MIM structure capacitor. The MIM structure capacitor is similar to that of Embodiment 1 in the configuration of the lower electrode DE, capacitor insulating film CEL, and upper electrode UE so that description on them is omitted.

As illustrated in FIG. 16, the electrode groove 40 formed in the insulating film 42 has an upper portion (inclined portion) 43*b* obtained by processing to have an inclination of a first angle θ1 and a lower portion 43*c* obtained by processing to have an inclination of a second angle θ2 greater than the first angle θ1. The term "first angle θ1" as used herein means an angle formed between a plane parallel to an upper surface 43*a* of the insulating film 42 having no electrode groove 40 formed therein and the side surface of the insulating film 42 at the inclined upper portion 43*b* of the electrode groove 40 and it is, for example, from about 30 to 80° C. The term "second angle θ2" as used herein means an angle formed between a plane parallel to the upper surface 43*a* of the insulating film 42 having no electrode groove 40 formed therein and the side surface of the insulating film 42 at the lower portion 43*c* of the electrode groove 40. The side surface of the upper portion 43*b* can be formed by using sputter etching or treatment with HF (hydrofluoric acid) after formation of the electrode groove 40.

As illustrated in FIG. 17, the lower electrode DE is embedded in the electrode groove and the capacitor insulating film CEL and the upper electrode UE are formed over the lower electrode DE.

A W film configuring the lower electrode DE is embedded in the electrode groove 40 formed in the insulating film 42. The lower electrode DE is formed in the following manner. First, a barrier metal film 44 is formed in the electrode groove 40 in the insulating film 42. The barrier metal film 44 is, for example, a film stack obtained by sequentially stacking a Ti film and a TiN film in the order of mention by sputtering and it has a thickness of, for example, from about 3 to 5 nm. Then, a W film is deposited by CVD so as to completely fill the electrode groove 40. The W film and the barrier metal film 44 outside the electrode groove 40 are then removed by CMP.

As described above referring to FIG. 4, however, when the upper angular portion of the electrode groove 40 to be embedded with the lower electrode DE has an angle close to 90°, a slurry is likely to remain at the upper portion of the side surface of the electrode groove 40 during CMP. At this site, a polishing rate increases and a portion of the W film and the barrier metal film 56 is sometimes etched more deeply than the other portion of these films by about several nm. In addition, after the CMP, washing for removing the slurry may etch the exposed barrier metal film 44. The capacitor insulating film CEL to be formed over the lower electrode DE is then deposited along the etched shape of the W film or the barrier metal film 44. As a result, the capacitor insulating film CEL may partially become thin at the upper portion of the side surface of the electrode groove 40. This is likely to cause an increase in leakage current because stress concentration occurs at the upper portion of the side surface of the electrode groove 40.

In Embodiment 3, however, an inclination of a predetermined angle is provided at the upper portion of the side surface of the electrode groove 40 to be embedded with the lower electrode DE, which prevents remaining of the slurry at the upper portion of the side surface of the electrode groove 40 during the CMP and therefore prevents deep etching of the W film or barrier metal film 44 at this portion. The capacitor insulating film CEL is formed along the shape of the lower electrode DE so that the capacitor insulating film CEL having almost a uniform thickness can be formed at the upper portion of the side surface of the electrode groove 40. Even if a stress is applied to the capacitor insulating film CEL at the upper portion of the side surface of the electrode groove 40, the stress is applied to the capacitor insulating film CEL over the entire inclined surface, making it possible to prevent stress concentration on a portion of the capacitor insulating film CEL.

Thus, in this Embodiment 3, since an inclination is provided at the upper portion of the side surface of the electrode groove 40 to be embedded with the lower electrode DE, it is possible to prevent stress concentration on a portion of the capacitor insulating film CEL, thereby preventing an increase in the leakage current of the capacitor insulating film CEL.

Embodiment 4

A semiconductor device according to Embodiment 4 of the present invention is similar to Embodiment 3 and has an MIM structure capacitor. It is however different from that of Embodiment 1 in the configuration of an upper electrode UE of the capacitor. In Embodiment 1, the upper electrode UE comprised of two metal film layers, that is, the lower metal film (TiN film 22) and the cap metal film (Ti film 23) formed by sputtering was described. In Embodiment 4, on the other hand, an upper electrode UE comprised of a single metal film layer (for example, Ti film or TiN film) formed using MOCVD (metal organic chemical vapor deposition) is described.

Figure 18:
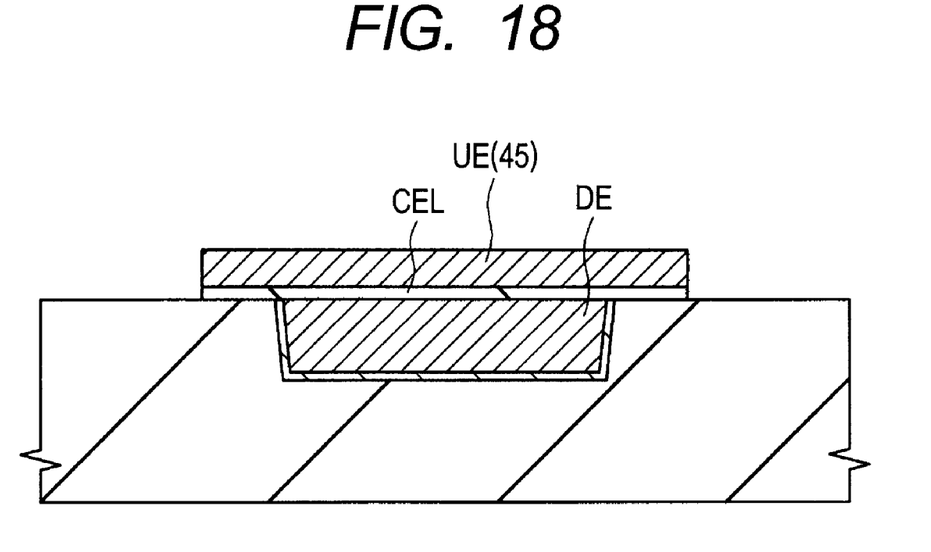
FIG. 18 is a fragmentary cross-sectional view illustrating the MIM structure capacitor according to Embodiment 4 of the invention.

FIG. 18 is a fragmentary cross-sectional view of an MIM structure capacitor according to Embodiment 4.

MOCVD can form a more dense metal film than plasma CVD because it can easily control the composition, structure, or the like. Even if the upper electrode UE is comprised of a single layer of the metal film 45, it is therefore possible to prevent penetration of the atmospheric oxygen into the metal film 45 and prevent oxidation of the metal film 45 along the grain boundary. Since the upper electrode UE is resistant to oxidation, stress (compressive stress) concentration does not occur at the end portion of the lower electrode DE. A tensile stress imposed on the capacitor insulating film CEL for reducing the compressive stress is therefore alleviated. As a result, deterioration of the capacitor insulating film CEL can be prevented.

The present invention made by the present inventors was described specifically based on some embodiments of the present invention. It is however needless to say that the invention is not limited by these embodiments and can be changed without departing from the scope of the invention.

The present invention is effective when applied to a semiconductor device having an MIM structure capacitor.

The invention claimed is:

1. A semiconductor device comprising:
a capacitor including a lower electrode embedded in a groove formed in an insulating film over a main surface of a semiconductor substrate, a capacitor insulating film formed over the lower electrode, and an upper electrode formed over the capacitor insulating film,
wherein the lower electrode is comprised of a first metal film,
wherein the upper electrode is comprised of a film stack of a second metal film and a third metal film formed over the second metal film,
wherein the third metal film itself is oxidized to prevent diffusion of atmospheric oxygen into the second metal film, and
wherein the third metal film is a Ti film.

2. The semiconductor device according to claim 1, wherein the third metal film has a thickness of from 5 to 15 nm.

3. The semiconductor device according to claim 1, wherein the second metal film is a TiN film.

4. The semiconductor device according to claim 1, wherein a barrier metal film is formed between the first metal film and the side surface of the groove.

5. The semiconductor device according to claim 4, wherein the first metal film is a W film and the barrier metal film is a TiN film or a film stack of a Ti film and a TiN film.

6. A semiconductor device comprising:
a capacitor including a lower electrode embedded in a groove formed in an insulating film over a main surface of a semiconductor substrate, a capacitor insulating film formed over the lower electrode, and an upper electrode formed over the capacitor insulating film,
wherein the lower electrode is comprised of a first metal film,
wherein the upper electrode is comprised of a film stack of a second metal film, a third metal film formed over the second metal film, and a fourth metal film formed over the third metal film obtained by depositing the second metal film, the third metal film, and the fourth metal film sequentially without exposure to the atmosphere,
wherein the third metal film itself is oxidized to prevent diffusion of atmospheric oxygen into the second metal film, and
wherein the third metal film is a Ti film.

7. The semiconductor device according to claim 6, wherein the third metal film has a thickness of from 5 to 15 nm.

8. The semiconductor device according to claim 6, wherein the second and fourth metal films are each a TiN film.

9. The semiconductor device according to claim 6, wherein a barrier metal film is formed between the first metal film and the side surface of the groove.

10. The semiconductor device according to claim 9, wherein the first metal film is a W film and the barrier metal film is a TiN film or a film stack of a Ti film and a TiN film.

11. A semiconductor device comprising:
a capacitor including a lower electrode formed over the main surface of a semiconductor substrate, a capacitor insulating film formed over the lower electrode, and an upper electrode formed over the capacitor insulating film,
wherein the lower electrode is comprised of a first metal film embedded in an electrode groove formed in an insulating film over a main surface of the semiconductor substrate,
wherein the electrode groove has, at the upper portion of the side surface thereof, an inclination,
wherein the upper electrode is comprised of a film stack of a second metal film and a third metal film formed over the second metal film,
wherein the third metal film itself is oxidized to prevent diffusion of atmospheric oxygen into the second metal film, and
wherein the third metal film is a Ti film or a film stack of a Ti film and a TiN film.

12. The semiconductor device according to claim 11, wherein the third metal film has a thickness of from 5 to 15 nm.

13. The semiconductor device according to claim 11, wherein the second metal film is a TiN film.

14. The semiconductor device according to claim 11, wherein a barrier metal film is formed between the first metal film and the side surface of the electrode groove.

15. The semiconductor device according to claim 14, wherein the first metal film is a W film and the barrier metal film is a TiN film or a film stack of a Ti film and a TiN film.

16. A semiconductor device comprising:
a semiconductor substrate having a first main surface and a second main surface opposite to the first main surface;
a groove formed in a first insulating film over the first main surface of the semiconductor substrate;
a barrier metal film formed over an inner surface of the groove;
a first electrode formed over a surface of the barrier metal film and embedded in the groove;
a second insulating film formed in contact with the surface of the barrier metal film of the first main surface side and a surface of the first electrode of the first main surface side; and
a second electrode formed over a surface of the second insulating film,
wherein the first electrode is comprised of a first metal film,
wherein the second electrode is comprised of a film stack of a second metal film and a third metal film formed over a surface of the second metal film, and
wherein the third metal film is a Ti film.

17. The semiconductor device according to claim 16, wherein the second metal film a TiN film.

18. The semiconductor device according to claim 17, wherein the first metal film is a W film and the barrier metal film is a TiN film or a film stack of a Ti film and a TiN film.

* * * * *